United States Patent [19]

Allfather

[11] Patent Number: 4,973,919

[45] Date of Patent: Nov. 27, 1990

[54] AMPLIFYING WITH DIRECTLY COUPLED, CASCADED AMPLIFIERS

[75] Inventor: Lars P. Allfather, Boston, Mass.

[73] Assignee: Doble Engineering Company, Watertown, Mass.

[21] Appl. No.: 328,051

[22] Filed: Mar. 23, 1989

[51] Int. Cl.⁵ .............................................. H03F 3/68
[52] U.S. Cl. .................................... 330/310; 330/200
[58] Field of Search .......... 330/51, 84, 124 D, 124 R, 330/152, 200, 297, 310, 311

[56] References Cited

U.S. PATENT DOCUMENTS

| | | | |
|---|---|---|---|
| 3,423,689 | 1/1969 | Miller et al. | 330/200 |
| 4,454,480 | 6/1984 | Allfather et al. | 330/310 X |
| 4,559,502 | 12/1985 | Huijsing | 330/310 X |
| 4,588,956 | 5/1986 | de Corlieu et al. | 330/310 X |

Primary Examiner—Steven Mottola
Attorney, Agent, or Firm—Fish & Richardson

[57] ABSTRACT

A signal is amplified with a plurality of amplifiers, each amplifier having a reference port, a reference node coupled to the reference port, and a signal port, and each amplifier being supplied by a power source with operating potential with respect to the reference node that is coupled to the reference port of that amplifier. The amplifiers are cascaded in a manner selected so that the output of a first amplifier (which receives the signal to be amplified at its input port) drives the reference node of a second amplifier, and the reference node of the first amplifier provides an input at the signal port of the second amplifier, whereby the first and second amplifiers are directly coupled together to amplify the applied signal.

13 Claims, 5 Drawing Sheets

AMPLIFYING WITH DIRECTLY COUPLED, CASCADED AMPLIFIERS

BACKGROUND OF THE INVENTION

This invention relates to amplifying schemes which use a number of amplifiers to provide output voltage and power swings greater than those available from a single amplifier.

It is known to cascade amplifiers in series, parallel, or in series/parallel combinations, to increase the overall voltage swing and power output of the amplifier arrangement without increasing the magnitude of the power supply voltages, and also to facilitate impedance matching to loads.

In some arrangements, for example, those described in U.S. Pat. No. 4,454,480, issued to Allfather et al., identical amplifiers are cascaded between a common (e.g., ground) terminal and an output terminal. Each amplifier includes a dual polarity power supply, the common (i.e., reference) node of which is driven by the output of the immediately preceding amplifier in the cascade arrangement. A signal to be amplified is applied in series to the inputs of the amplifiers. Typically, the signal is applied between the common node of each amplifier's power supply and the input of the amplifier using an isolation amplifier or an isolation transformer. Because each signal is referenced at the same potential as the power supply of the amplifier to which the signal is applied, the source of the signal to be amplified must be capable of producing voltage swings that are greater than the voltage swings generated by a single amplifier.

SUMMARY OF THE INVENTION

The invention features, in general, amplifying a signal with a plurality of amplifiers, each amplifier having a reference port and a signal port and each amplifier being supplied by a power source with operating potential with respect to a reference node that is coupled to the reference port of that amplifier; the amplifiers are cascaded in a manner selected so that the output of a first amplifier (which receives the signal to be amplified at its input port) drives the reference node of a second amplifier, and the reference node of the first amplifier provides an input at the signal port of the second amplifier, whereby the first and second amplifiers are directly coupled together to amplify the applied signal.

Because the amplifiers (e.g., Class B amplifiers) are directly cascaded, the need for signal isolation amplifiers, signal isolation transformers, or other devices between the amplifiers is eliminated. As a result, the source of the input signal need not provide a voltage swing greater than that which can be produced by a single amplifier. Because each amplifier reproduces the voltage between the reference node of its power source (i.e., the output of the previous stage) and the voltage at the reference node of the previous stage, input signal voltage and power are both cascaded and amplified.

In general, the performance parameters of the amplifiers are additive in this arrangement. For example, if there are N amplifiers which have identical unity inverting voltage gains ($A_V$) and identical current gains ($A_I$), the total voltage gain is $N \cdot A_V$ and the overall power gain is N multiplied by the power gain of a single amplifier. For example, if $A_V = -1$, the total voltage gain is $-N$. Also, the total slew rate equals N multiplied by the slew rate of one amplifier. On the other hand, the overall current gain of the arrangement equals the current gain of a single stage, and the total gain-bandwidth is that of a single stage. Moreover, if the N power supplies for the N amplifiers each supply an operating potential V, the cascaded amplifiers can produce an output signal having a maximum (i.e., nonclipped) voltage of $N \cdot V$ volts.

Preferred embodiments include the following features.

The amplifiers are cascaded by electrically coupling the output of the first amplifier to the reference port of the second amplifier, and connecting the reference port of the first amplifier to the signal port of the second amplifier.

Alternatively, the amplifiers can be arranged to amplify the input signal in parallel. This is done by decoupling the reference port of the second amplifier from the output of the first amplifier and decoupling the signal port of the second amplifier from the reference port of the first amplifier. Instead, the signal ports of the first and second amplifiers are coupled together and the outputs of the first and second amplifiers are also coupled together. In this case, the reference ports of the first and second amplifiers are coupled to a reference (e.g., ground) potential, and resistances are coupled in series with the amplifier outputs to compensate for small differences in amplifier parameters (e.g., gain and offset).

The power sources each convert an applied A.C. potential to D.C. potentials having opposite polarities and couple the D.C. potentials to the associated amplifier. This is preferably done with a power transformer that has a primary winding coupled to a source of A.C. potential and a secondary winding for developing the D.C. potentials; the secondary winding includes a center tap that forms the common node of the power source.

Other features and advantages of the invention will be apparent from the following detailed description, and from the claims, with reference to the accompanying drawings in which:

DETAILED DESCRIPTION

Figure 1:
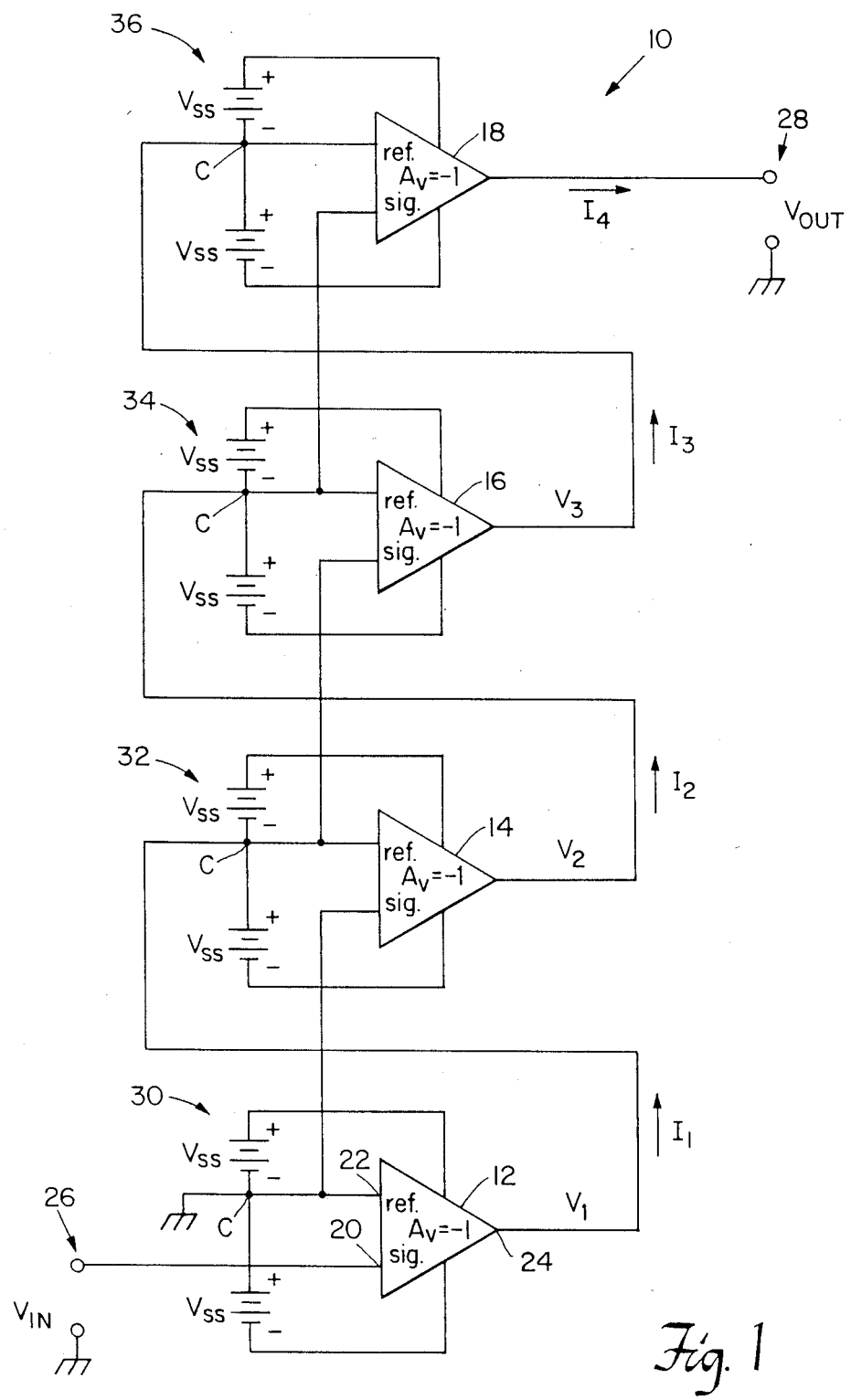
FIG. 1 is a block diagram of the amplifying system of the invention.

Referring to FIG. 1, the amplifying system 10 of the invention includes a plurality of (such as four) amplifiers 12, 14, 16, 18 that are preferably identical Class B devices. Each amplifier (e.g., amplifier 12) includes a signal input port (sig) 20 and a reference port (ref) 22. The output 24 of each amplifier (e.g., amplifier 12) is connected to the next succeeding amplifier (e.g., amplifier 14) and as a result amplifiers 12–18 are serially cascaded between input terminal 26 and output terminal 28.

Amplifiers 12, 14, 16, 18 operate using dedicated dual polarity D.C. power supplies 30, 32, 34, 36, respectively, which are each represented in FIG. 1 by a pair of batteries $V_{ss}$. Each power supply is arranged to couple potentials of $+V_{ss}$ and $-V_{ss}$ with respect to its own common node C to the associated amplifier. The common node C of power supply 30 is connected to ground potential, while the common nodes of power supplies 32, 34, 36 "float" above ground.

Amplifiers 12-18 are directly cascaded according to the invention so that the signal needed to drive each amplifier is supplied directly by the preceding amplifier, without the use of any isolation amplifiers, isolation transformers, or instrumentation amplifiers between amplifiers 12-18. The output 24 of each stage drives the floating common node C of the power supply of the next succeeding amplifier, and the reference port 22 of each stage is connected to the signal port 20 of the following stage. For example, output 24 of amplifier 12 drives common node C of power supply 32, which is in turn connected to reference port 22 of amplifier 14. Signal port 20 of amplifier 14 gets its input directly from reference port 22 of amplifier 12.

This cascading scheme is followed for the remaining amplifiers in the arrangement. Thus, the output of amplifier 14 is applied to common node C of power supply 34 and the reference port of amplifier 16, the signal port 20 of which is connected to reference port 22 of amplifier 14. Common node C of power supply 36 (and hence reference port 22 of amplifier 18) is driven by the output of amplifier 16, the reference port 22 of which is tied to signal port 20 of amplifier 18. The arrangement is completed by connecting input terminal 26 (which is referenced to ground) to signal port 20 of amplifier 12, and connecting output port 24 of amplifier 18 to output terminal 28. Output terminal 28 is also referenced to ground.

Figure 2A:
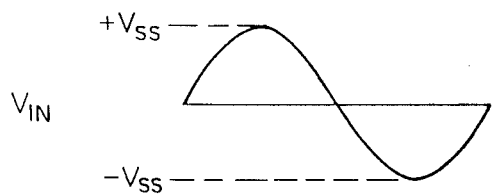
FIGS. 2A, 2B, 2C, 2D and 2E are waveforms useful in understanding the operation of FIG. 1.
Figure 2B:
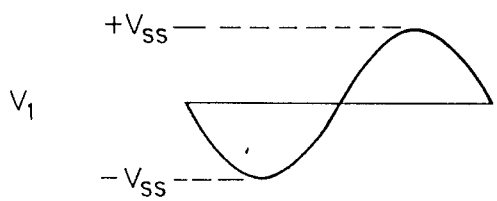
Figure 2C:
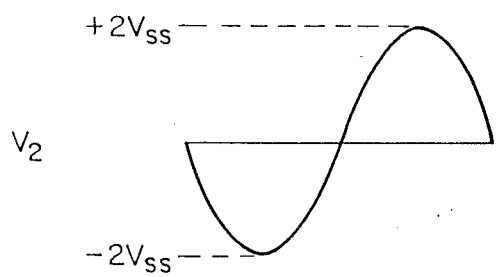
Figure 2D:
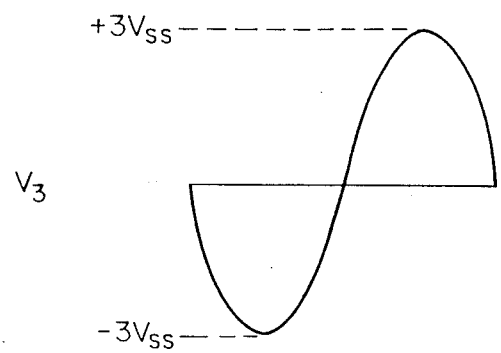
Figure 2E:
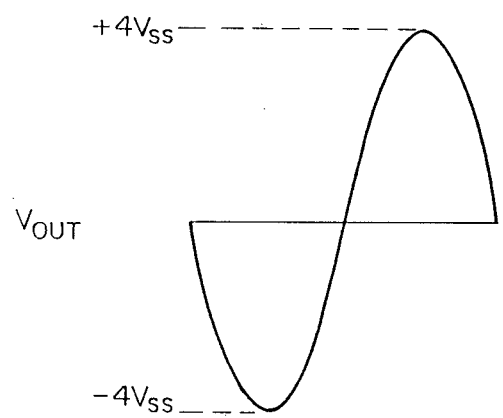

Referring also to FIGS. 2A-2E, in operation, let each amplifier have an inverting unity gain. With an input voltage $V_{IN}$ as shown in FIG. 2A, the output voltages of amplifiers 12 ($V_1$), 14 ($V_2$), 16 ($V_3$), and 18 ($V_{out}$) are shown in FIGS. 2B-2E, respectively. Each amplifier/power supply stage amplifies the voltage between its power supply common node C (i.e., the output of the previous stage) and the common node C of the power supply of the immediately preceding stage. As a result, the total voltage gain of amplifying arrangement 10 is the sum of the voltage gains ($A_V$) of individual amplifiers 12-18 (i.e., 4). That is $$\frac{V_{out}}{V_{IN}} = A_{V1} + A_{V2} + A_{V3} + A_{V4}$$

Also, because amplifiers 12-18 are identical and connected in series, current gain ($A_I$) of arrangement 10 equal those of a single amplifier. Accordingly, $I_1 = I_2 = I_3 = I_4$ It is thus seen that the power gain is also additive, the total power gain equalling the power gain of an individual amplifier multiplied by the number of cascaded amplifiers.

Note also from FIGS. 2B-2E that, although each amplifier 12-18 operates from a power supply of $\pm V_{ss}$, all amplifiers except for initial amplifier 12 can produce outputs having greater voltage swing than $\pm V_{ss}$ without clipping. This is because of the serial cascading of amplifiers 12-18. In general, (assuming equal $V_{ss}$ magnitudes for all power supplies) the maximum voltage swing of the arrangement is equal to the number of amplifiers multiplied by the maximum voltage swing ($\pm V_{ss}$) of one amplifier. Thus, amplifier 14 can generate an output of $\pm 2V_{ss}$, an output of $\pm 3V_{ss}$ can be produced by amplifier 16, and the total voltage swing of arrangement 10 (at output terminal 28) is $\pm 4V_{ss}$.

Other advantages follow from serially cascading amplifiers 12-18 as in FIG. 1. For example, the slew rate of arrangement 10 becomes the slew rate of a single amplifier multiplied by the number of amplifiers.

Figure 3:
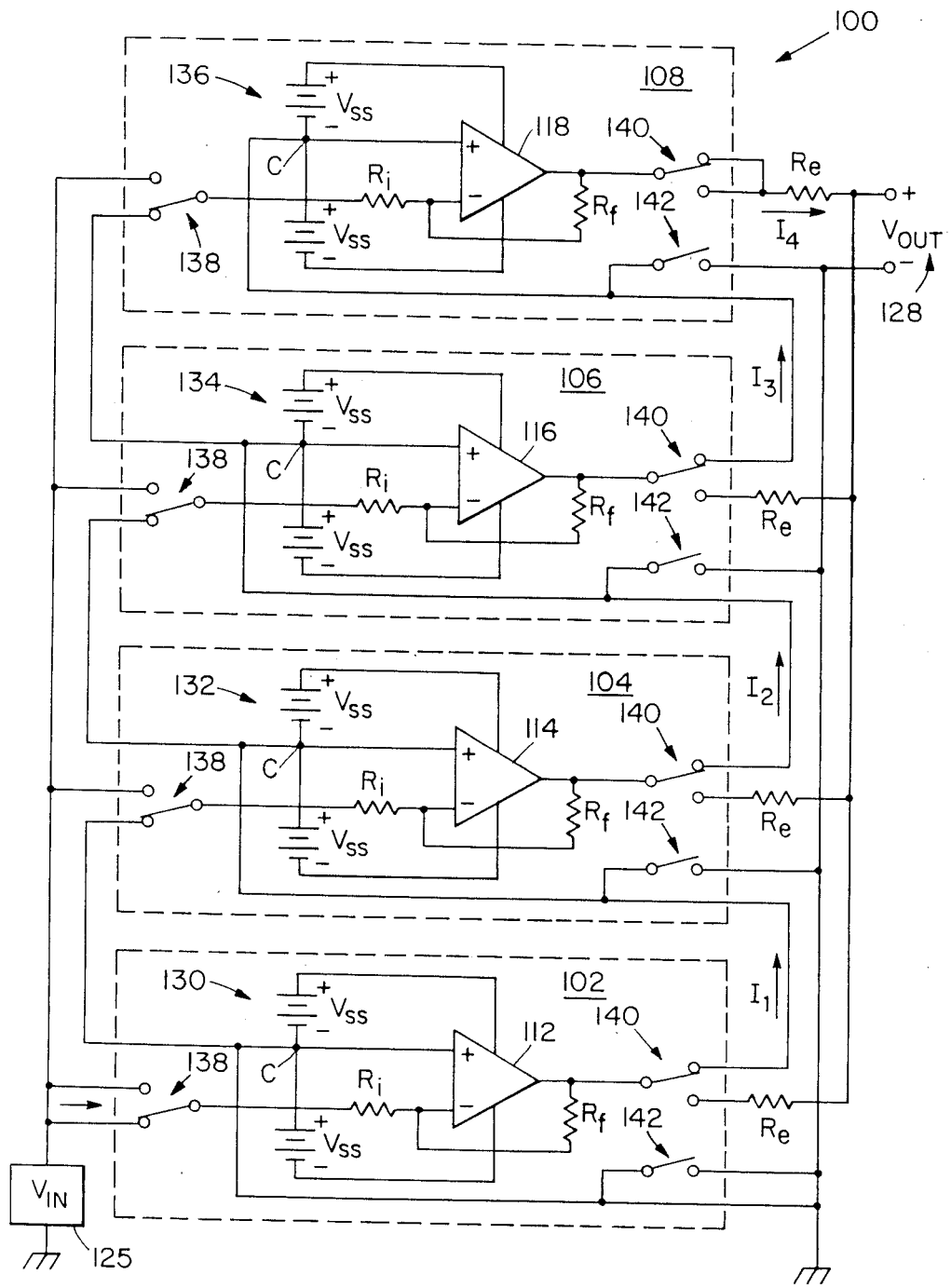
FIG. 3 is a schematic diagram of the amplifying system of FIG. 1.

Referring to FIG. 3, a specific circuit 100 for implementing amplifying arrangement 10 (FIG. 1) is shown. Amplifying system 100 comprises a plurality of (such as four) identical amplifier circuit sections 102, 104, 106, 108. Sections 102-108 respectively include differential amplifiers 112-118 and power supplies 130-136. Each power supply 130-136 is represented by a pair of batteries connected to provide operating potentials of $\pm V_{ss}$ (with respect to a common power supply node C) to the associated amplifiers 112-118.

Each amplifier section 102-108 also includes a set of switches 138, 140, 142 for cascading sections 102-108 between a source 126 of input voltage ($V_{IN}$) and an output terminal 128.

One switched terminal of switches 138 in sections 108, 106, 104 is connected to input voltage source 126, and the other switched terminal of each such switch 138 is connected to the common node C of the power supply 134, 132, 130 of the immediately preceding amplifier section 106, 104, 102, respectively. Both switched terminals of switch 138 in amplifier section 102 are connected to source 126.

Amplifiers 112-118 are operational amplifiers having a gain of $-1$ as determined by resistors $R_i$ and $R_f$. The inverting ($-$) input of each amplifier 112-118 (e.g., amplifier 114) is driven from the common terminal of switch 138 in its amplifier section (e.g., section 104) and the noninverting ($+$) input provides a reference and is connected to the common node C of the amplifier's power supply (e.g., power supply 132).

Figure 4:
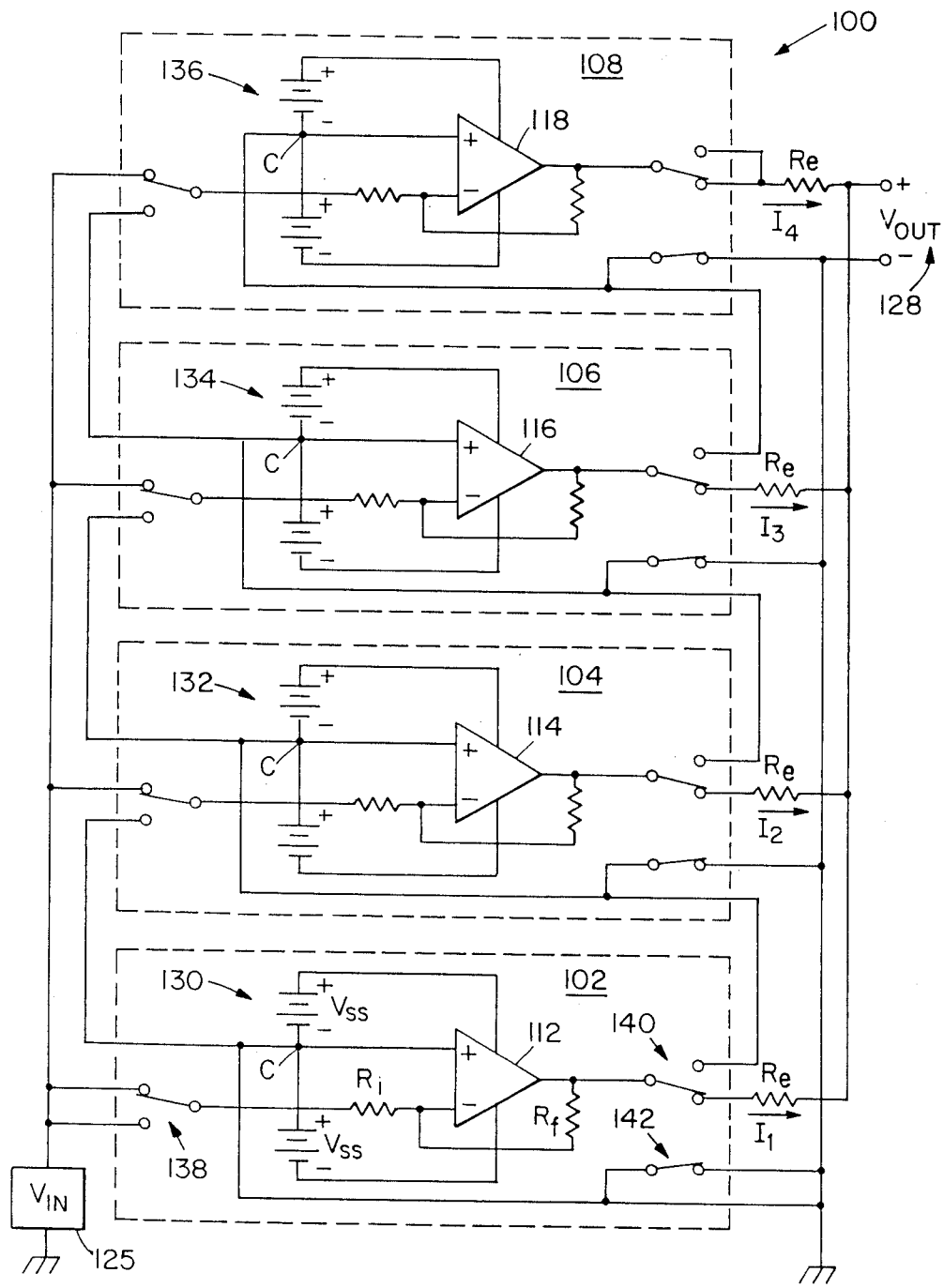
FIG. 4 is an alternative arrangement of the amplifying system of FIG. 3.

Amplifiers 112-116 drive either the next succeeding amplifier 114-118, respectively, or output terminal 128 via switches 140. More specifically, the outputs of amplifiers 112, 114, 116 are connected to the floating common nodes C of power supplies 132, 134, 136, respectively, when switches 140 are in the position shown in FIG. 3. When switches 140 are in the opposite position (as shown in FIG. 4, discussed below), amplifiers 112-118 drive output terminal 128 in parallel through resistors $R_e$. The output of amplifier 118 always drives output terminal 122 through its switch 140.

Amplifying system 100 is referenced to the same potential (e.g., ground) as voltage source 126. To establish this reference potential, the common node C of power supply 130 (and hence the noninverting (i.e., reference) input of amplifier 112) is always connected to ground potential, either directly or through switch 142. Switches 142 operate in tandem with switches 140 to alternatively connect the common nodes C power supplies 132-136 to ground potential when amplifiers 112-118 are to operate in parallel (as explained below in connection with FIG. 4).

In operation, with switches 138, 140, 142 all in the positions shown in FIG. 3, amplifiers 112-118 are serially cascaded between voltage source 126 and output terminal 128 and operate in the same manner as described above for amplifying system 10. Amplifying system 100 thus has a total voltage gain of $-4$ (i.e., the sum of the four inverting unity gains of amplifiers 112-118). On the other hand, the output currents $I_1-I_4$ of amplifiers 112-118, respectively, are all equal. That is, the total current gain of system 100 equals the current gain of a single amplifier. The maximum voltage swing of the output signal produced at terminal 128 is $\pm 4V_{ss}$, as discussed above.

Referring to FIG. 4, when switches 138, 140, 142 are all actuated to their opposite positions, amplifiers 112-118 are cascaded in parallel between voltage source 126 and output terminal 128 through switches 138, 140. Also, the common node C of each power supply 130-136 (and thus the noninverting input of each amplifier 112-118) is connected to ground potential through switches 142. As a result, the total voltage gain of system 100 becomes that of a single amplifier (i.e., $-1$). On the other hand, the output currents $I_1$-$I_4$ add, and hence the total current gain is four times the current gain of each amplifier 112-118.

Resistors $R_e$ are present to compensate for small differences in the parameters (such as gain and offset) of amplifiers 112-118. The closer that the amplifiers are matched, the smaller equalizing resistors $R_e$ may be. As the resistances of resistors $R_e$ decrease, so, too, are the errors and deficiencies that they cause reduced.

Other embodiments are within the following claims.

For example, although four amplifiers have been shown, more or fewer amplifiers can be cascaded in accordance with the invention.

Figure 5:
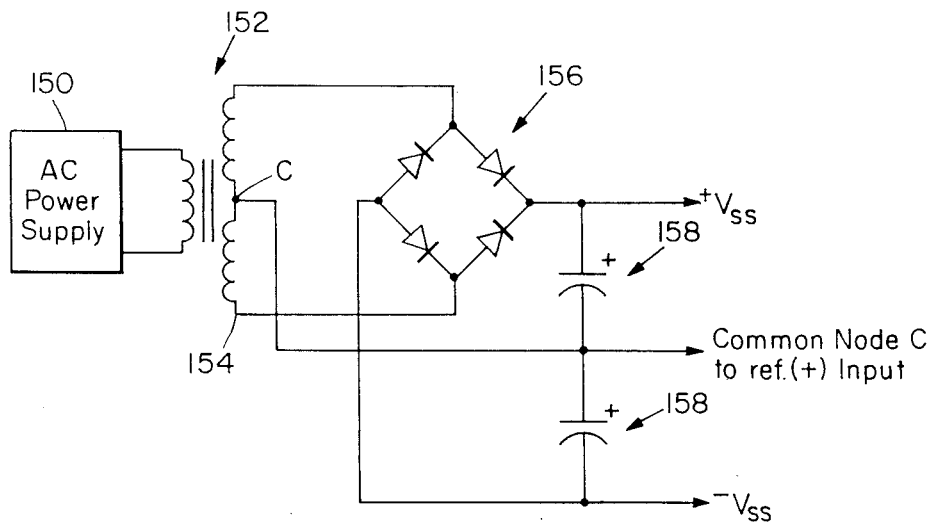
FIG. 5 is a diagram of one embodiment of the power supplies used in FIGS. 1, 3, and 4.

Referring to FIG. 5, power supplies 30-36, 130-136 can each be implemented by full-wave rectifying an A.C. signal from source 150 using a transformer 152 having a center tapped secondary winding 154 and a diode bridge 156. The center tap becomes the common node C of the power supply and also serves as the reference for D.C. supply voltages $\pm V_{ss}$ and for ripple capacitors 158.

I claim:

1. Apparatus for amplifying a signal, comprising
a plurality of amplifiers, each amplifier having a reference port, a reference node coupled to said reference port, and a signal port, said signal being applied to the signal port of a first one of said amplifiers,
a plurality of power sources, each power source supplying operating potential to one of said amplifiers with respect to the reference node that is coupled to said reference port of said amplifier, and
circuitry for cascading said amplifiers in a manner selected so that an output of said first amplifier drives the reference node of a second one of said amplifiers, and the reference node of said first amplifier provides an input at the signal port of said second amplifier, whereby said first and second amplifiers are directly coupled together to amplify said signal.

2. The apparatus of claim 1 wherein said cascading circuitry electrically couples the output of said first amplifier to the reference port of said second amplifier, and connects the reference port of said first amplifier to the signal port of said second amplifier.

3. The apparatus of claim 2 wherein the reference port of said first amplifier is coupled to a reference potential equal to a reference potential for said input signal.

4. The apparatus of claim 1 wherein said plurality of power sources each comprises circuitry for converting an A.C. potential applied to said power source to a pair of D.C. potentials having opposite polarities and equal magnitudes with respect to a potential at said reference node, and applying said D.C. potentials to said amplifier.

5. The apparatus of claim 4 wherein said converting circuitry comprises a transformer having a primary winding coupled to a source of A.C. potential and a secondary winding for developing said D.C. potentials, said secondary winding having a center tap that comprises the reference node.

6. The apparatus of claim 2 wherein said cascading circuitry further comprises switching circuitry for selectively
(a) decoupling the reference port of said second amplifier from the output of said first amplifier, and decoupling the signal port of said second amplifier from the reference port of said first amplifier, and
(b) coupling the signal ports of said first and second amplifiers together and coupling the outputs of said first and second amplifiers together, whereby said first and second amplifiers amplify said signal in parallel.

7. The apparatus of claim 6 wherein said cascading circuitry further comprises switching circuitry for selectively coupling the reference ports of said first and second amplifiers to a common reference potential when said amplifiers are amplifying in parallel.

8. The apparatus of claim 6 further comprising circuitry for coupling resistances in series with the outputs of said first and second amplifiers when said outputs are coupled together.

9. The apparatus of claim 1 wherein there are N amplifiers having substantially identical gains, whereby the total voltage gain of the apparatus equals N multiplied by the voltage gain of a single amplifier and the total current gain of the apparatus equals the current gain of one amplifier.

10. The apparatus of claim 9 wherein said substantially identical gains equal $-1$.

11. The apparatus of claim 1 wherein there are N power sources supplying operating potentials of substantially the same magnitude, V, whereby the apparatus can produce an output signal having a maximum potential of N multiplied by V.

12. The apparatus of claim 1 wherein said plurality of amplifiers are like power amplifiers.

13. The apparatus of claim 12 wherein said plurality of amplifiers are class B amplifiers.

* * * * *